United States Patent [19]
Hermansdorfer et al.

[11] 3,943,382
[45] Mar. 9, 1976

[54] FREQUENCY OPERATED SWITCH

[75] Inventors: James E. Hermansdorfer; Wilbert E. Swygert, Jr., both of Charlottesville, Va.

[73] Assignee: Sperry Rand Corporation, New York, N.Y.

[22] Filed: Dec. 23, 1974

[21] Appl. No.: 535,523

[52] U.S. Cl............ 307/233 R; 307/234; 328/133; 328/138; 328/141
[51] Int. Cl.² ...................................... H03K 5/20
[58] Field of Search ........... 307/233, 234; 328/133, 328/141, 138

[56] References Cited
UNITED STATES PATENTS

| | | | |
|---|---|---|---|
| 3,521,174 | 7/1970 | Naubereit et al. | 328/141 X |
| 3,757,233 | 9/1973 | Dixon | 328/141 |
| 3,783,394 | 1/1974 | Avery | 307/233 |
| 3,803,599 | 4/1974 | McLean et al. | 307/233 |
| 3,808,407 | 4/1974 | Ratz | 328/133 |

*Primary Examiner*—Saxfield Chatmon, Jr.
*Attorney, Agent, or Firm*—Howard P. Terry; Joseph M. Roehl

[57] ABSTRACT

A switching circuit which is actuated when the frequency of an input signal falls below a specified value, includes an input circuit for providing a rectangular pulse train consisting of pulses having durations indicative of the frequency of the input signal. The rectangular wave train is used to actuate a pair of one-shot multivibrators adjusted to produce output pulses having durations such that the pulses from the first one-shot correspond to an upper reference frequency slightly below that of a nominal input frequency, and the pulses from the second one-shot correspond to a lower reference frequency equal to the minimum acceptable input frequency. The output signals from the one-shot multivibrators are applied to clock terminals of first and second edge-triggered flip-flops, whereas the D input terminals of the same flip-flops are actuated by the rectangular pulse train. Each edge-triggered flip-flop operates so that the first positive-going clock pulse transfers the instantaneous value of its D input signal to its output terminal. The transferred signals from the two flip-flops are applied to clear and preset terminals, respectively, of a latching flip-flop which produces a disabling signal when the frequency of the input signal falls below the minimum acceptable value and retains the disabling signal until the input frequency is increased to a level at least as high as that represented by the upper reference frequency.

7 Claims, 4 Drawing Figures

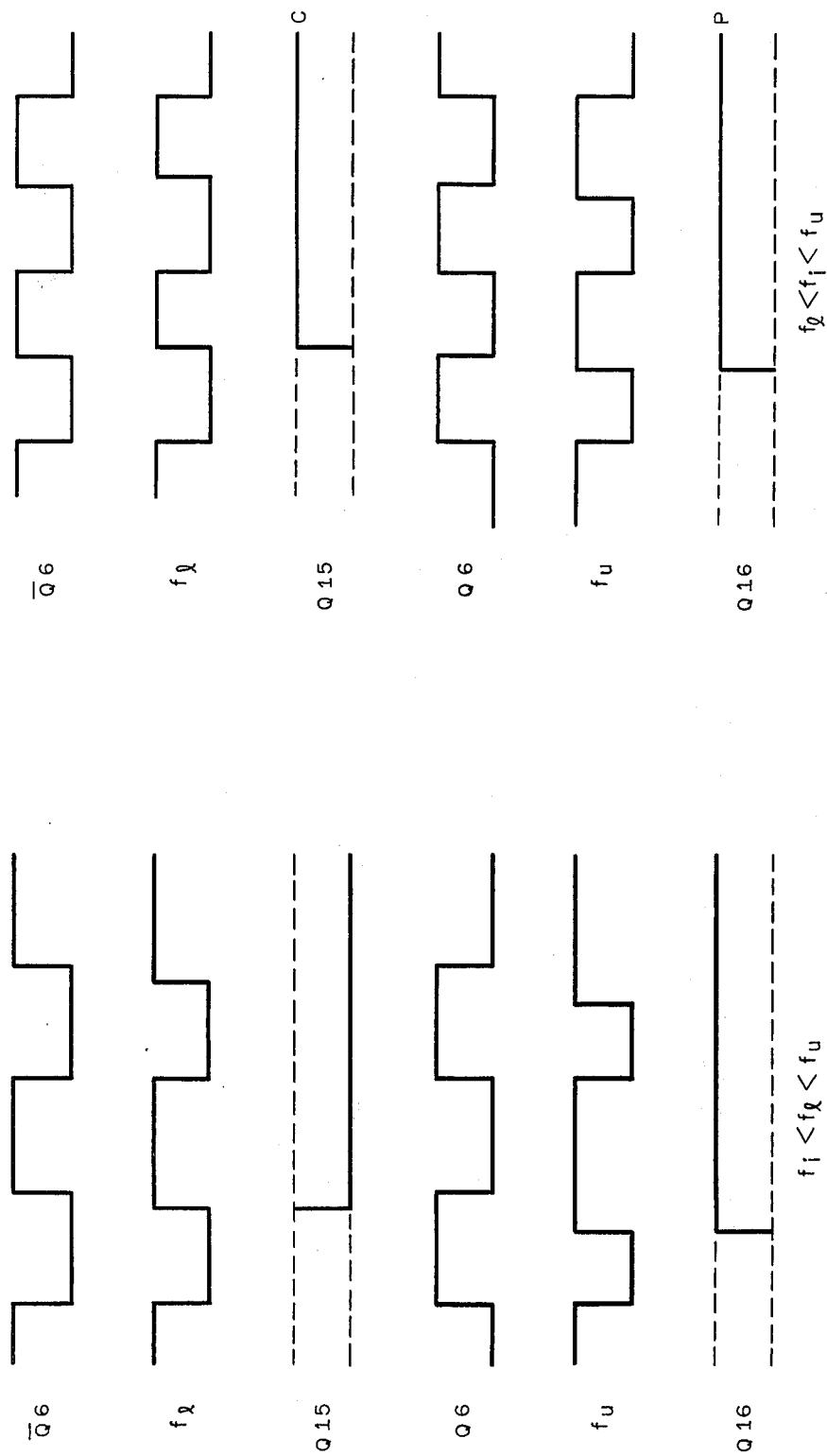

FREQUENCY OPERATED SWITCH

BACKGROUND OF THE INVENTION

1. Field of the Invention

This invention relates to frequency sensitive switches and more specifically to frequency sensitive switches having a hysteresis characteristic.

2. Description of the Prior Art

Various kinds of frequency sensitive switches are known in the prior art. Many of these switches employ resonant means as a reference. In one variety of such switches, for instance, a mechanical member such as a resonant reed is used as a reference. Such switches, however, are temperature sensitive and therefore require additional means to compensate for such sensitivity if the switch is to be used in critical applications.

Still other prior art frequency sensitive switches employ a resonant circuit as a reference. Such circuits, however, are sensitive to input voltage fluctuations.

The circuit of the present invention overcomes the excessive temperature and voltage sensitivity characteristics of these prior art circuits.

SUMMARY OF THE INVENTION

A switch for monitoring power line frequencies converts the input signals into a rectangular pulse train and compares the duration of the pulses in this train to upper frequency reference pulses having durations corresponding to a frequency slightly below the nominal power line frequency and lower frequency reference pulses having durations corresponding to the minimum acceptable input frequency. The switch provides a disabling signal when the input frequency falls below a value corresponding to the lower reference frequency and retains this disabling signal until the input frequency is increased to a value corresponding to the upper reference frequency.

BRIEF DESCRIPTION OF THE DRAWINGS

FIGS. 2, 3a and 3b are timing diagrams useful in explaining the operation of the invention.

DESCRIPTION OF THE PREFERRED EMBODIMENT

Figure 1:
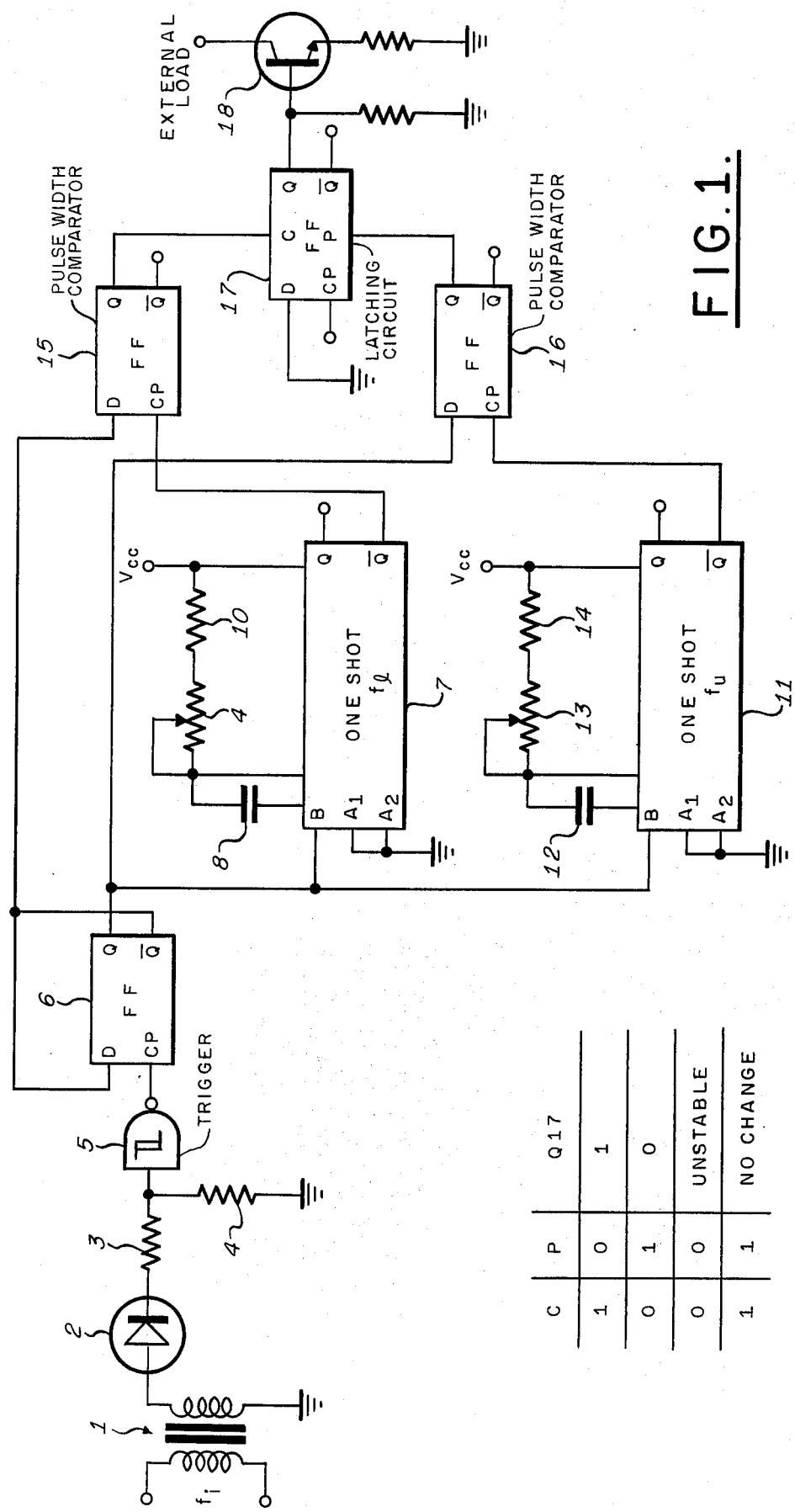
FIG. 1 is a schematic diagram illustrating a presently preferred embodiment of the invention.
Figure 2:
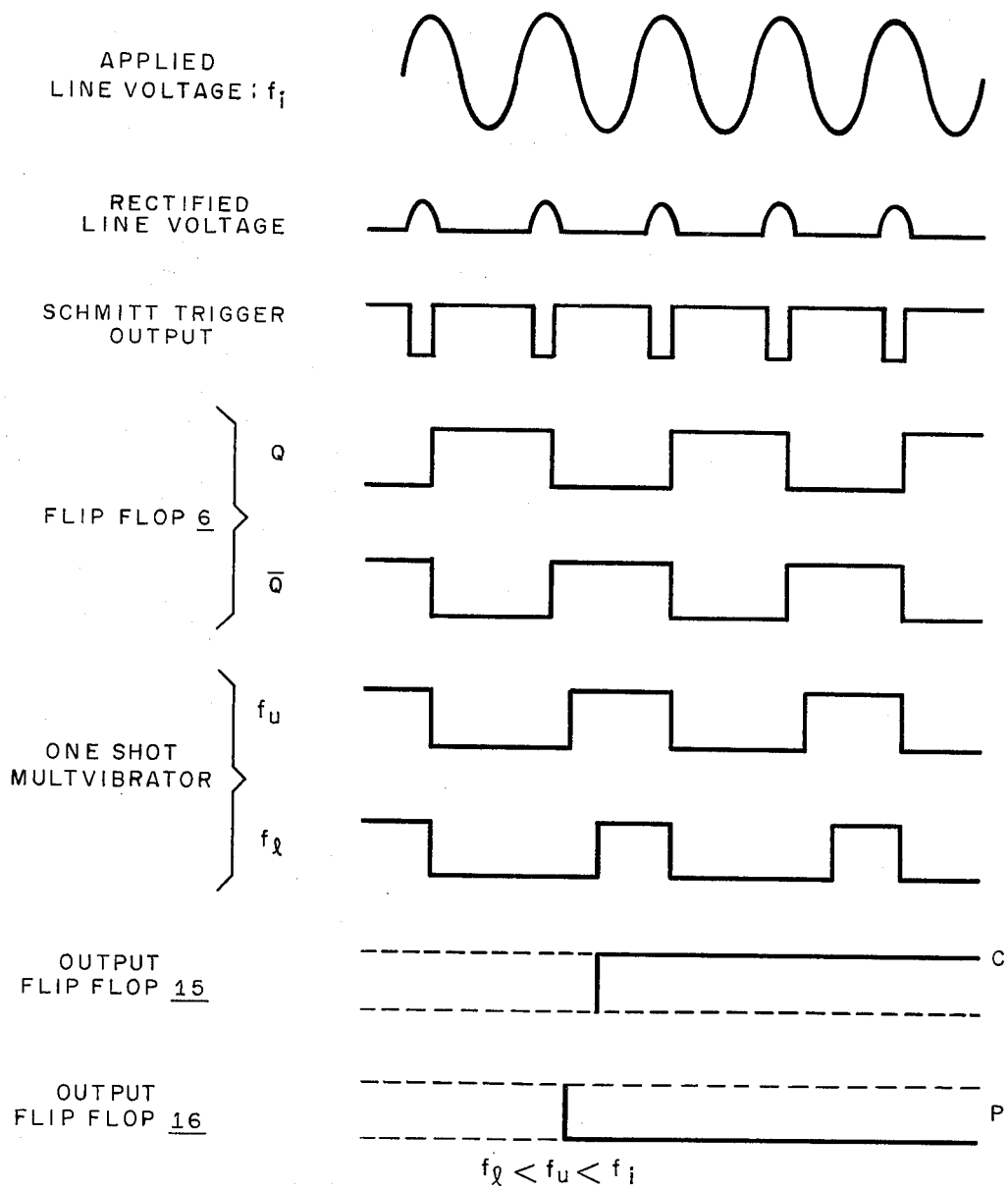

FIG. 1 illustrates a typical circuit employing the principles of the invention. For purposes of convenience, positive logic TTL components will be described. The input voltage at a frequency $f_i$ is applied to a transformer 1 whose output is rectified in a diode 2 and reduced in a voltage divider comprising the resistors 3 and 4 to a level suitable for driving a conventional Schmitt trigger 5. The output signal from the Schmitt trigger consists of a train of negative-going pulses having a repetition rate equal to the frequency of the applied line voltage as depicted in FIG. 2. The pulses from the Schmitt trigger are applied to the clock input of a conventional flip-flop 6. In a typical circuit, a commercially available integrated circuit such as Texas Instrument model 54/7474 flip-flop may be used for this purpose. The $\overline{Q}$ output terminal provides complementary output pulses and is connected to the D input terminal so that the flip-flop Q output is reversed in response to the trailing edges of successive pulses from the Schmitt trigger. The Q output terminal of the flip-flop 6 provides a train of true output pulses which are applied to the input terminal of a conventional one shot multivibrator 7. Conveniently, a commercially available monostable multivibrator such as the Texas Instrument model 54/74121 monostable multivibrator may be used for this purpose. An RC timing network including a capacitor 8, a variable resistor 9 and a fixed resistor 10 may be used for adjusting the quasi-stable pulse duration of the multivibrator 7 in accordance with well known principles.

The Q output terminal of the flip-flop 6 is also connected to a second one shot multivibrator 11 containing a similar RC timing network including a capacitor 12, a variable resistor 13, and a fixed resistor 14.

The timing network associated with the one shot multivibrator 7 is adjusted so that the quasi-stable pulse duration of this device is equal to the pulse duration of the output signals from the flip-flop 6 when the input frequency $f_i$ is at its minimum acceptable value. Thus the one shot multivibrator 7 serves to provide a lower frequency reference signal.

The timing circuit for the one shot multivibrator 11 is adjusted so that the quasi-stable pulse duration of this multivibrator is equal to the duration of the pulses from the flip-flop 6 when the input frequency $f_i$ is slightly below the nominal frequency and thus provides an upper frequency reference.

Typically, for a nominal input frequency of 400 Hz, the one shot multivibrator 7 may be adjusted to provide a lower frequency reference, $f_1$, equivalent to 385 Hz whereas the one shot multivibrator 11 may be adjusted to provide an upper frequency reference, $f_u$, equivalent to 390 Hz. The differential between the upper and lower frequency references permits the circuit to display a desirable hysteresis effect as will be described.

The signal pulse width is compared with the reference pulses from the one shot multivibrators in the pulse width comparator flip-flops 15 and 16. The D input terminals of the flip-flops 15 and 16 are connected to the $\overline{Q}$ and Q output terminals respectively of the flip flop 6 whereas the clock input terminals of the flip flops 15 and 16 are connected to the $\overline{Q}$, output terminals of the one shot multivibrators 7 and 11 respectively.

The Q output terminals of the pulse width comparator flip-flops 15 and 16 provide command signals which are applied to the CLEAR and PRESET terminals of a latching flip-flop 17, whose input terminal D is grounded. Any one of a variety of commercially available flip-flops may be used for components 15, 16 and 17. Texas Instruments model 54/7474, for instance, may be used for this purpose.

According to known principles, under these conditions a low level signal or ZERO applied to the PRESET input sets the Q output to a ONE. A ZERO applied to the CLEAR input sets the Q output to a ZERO. If a ONE is applied to both the CLEAR and PRESET inputs, the Q output stays the same as it was before the input conditions were established. This mode of operation is summarized in the table in FIG. 1.

The Q output terminal of the latching flip-flop 17 is coupled to a suitable switching transistor 18 which may be used to control an external load.

The flip-flops 15, 16 and 17 constitute a logic circuit which provides enabling and disabling signals in accordance with relative pulse widths.

The operation of the circuit under normal conditions wherein the frequency of the applied line voltage is greater than both references, may be understood with the help of FIG. 2, which illustrates circuit conditions when the input signal is at its nominal frequency value.

Under these conditions, the upper frequency reference pulses, $f_u$, have a duration slightly longer than the duration of the Q pulses from the flip-flop 6. The positive-going edge of a Q pulse triggers the one shot multivibrator 11. When the one shot multivibrator 11 switches at the end of its quasi-stable state, the Q output terminal of the flip-flop 6 is at a low voltage level. The positive-going edge of the pulse from the one shot multivibrator 11 at this time actuates the flip-flop 16 so that a low level command signal is transferred through its Q output terminal to the PRESET terminal of the latching flip-flop 17. The positive-going edge of the corresponding $f_1$ pulse from the one shot multivibrator 7 is applied to the clock input terminal of the flip-flop 15 when the $\overline{Q}$ output terminal of the flip-flop 6 is at a high level so that the flip-flop 15 provides a high level command signal to the CLEAR terminal of the latching flip-flop 17. Under these conditions, the flip-flop 17 will be switched so that a high level signal will appear at its output terminal Q and the transistor 18 will be driven into conduction so as to permit normal operation of the load.

FIG. 3a illustrates circuit conditions when the input frequency becomes lower than the minimum acceptable value and FIG. 3b illustrates circuit conditions when the input frequency is between the threshold values.

Referring specifically to FIG. 3a, under conditions wherein the input frequency has dropped to an unacceptable level, the Q6 output pulses will have durations longer than the durations of the pulses from either one shot multivibrator. The $f_1$ pulses will be compared with the $\overline{Q6}$ pulses in the pulse width comparator flip-flop 15. The positive-going edge of the $f_1$ pulse will occur when the $\overline{Q6}$ pulse is at a low (ZERO) level and this value will be transferred to the CLEAR terminal of the latching flip-flop 17. At the same time, the $f_u$ reference pulses from the multivibrator 11 will be compared with the Q6 pulses from the input flip-flop 6 pulses from the input flip-flop 6 in the pulse width comparator flip-flop 16. The positive-going portion of the $f_u$ pulses occur when the Q6 pulse is at a high (ONE) level so that this value will be transferred to the Q16 terminal and appear as a ONE level at the PRESET terminal of the latching flip-flop 17. Under these conditions, the Q output of the flip-flop 17 will be switched to a ZERO level and the transistor 18 will become non-conductive thus disabling the external load.

The circuit conditions that obtain when the input frequency is between the threshold references are illustrated in FIG. 3b. Under these conditions, the pulses from the flip-flop 6 have a duration which is shorter than the $f_1$ pulses but longer than the $f_u$ pulses. The positive-going portion of the $f_1$ pulses occur when the $\overline{Q6}$ pulses are at a high level and thus serve to drive the CLEAR input terminal of the latching flip-flop 17 to a ONE level. Since the $f_u$ pulses are compared with the Q6 pulses, the positive-going portions of the $f_u$ pulses also serve to transfer a high level signal to the output of the pulse width comparator flip-flop 16 and thus drive the PRESET terminal of the flip-flop 17 to a ONE level. Thus with the input frequency between the two threshold values, both the CLEAR and PRESET terminals of the flip-flop 17 are at a ONE level and this flip-flop will experience no change.

The action of the circuit under various operating conditions may be readily visualized by referring to the following truth table:

| Frequency Hz | Q15 | Q16 | Q17 Decreasing Freq. | Q17 Increasing Freq. |
|---|---|---|---|---|
| 400 | 1 | 0 | ↓ 1 | ↑ 1 |
| 390+ | 1 | 0 | 1 | 1 |
| 390− | 1 | 1 | 1 | 0 |
| 385+ | 1 | 1 | 1 | 0 |
| 385− | 0 | 1 | ↓ 0 | 0 |
| 375 | 0 | 1 | 0 | 0 |

As can be seen from the foregoing table, the two reference frequencies, 390 Herz and 385 Herz, provide a hysteresis effect which disables the load only when the input frequency drops below the minimum acceptable value and maintains this disabled condition until the input frequency again increases through the upper frequency reference level.

The combination of this hysteresis and the latching function provided by the flip-flop 17 cooperate to minimize erratic action which might otherwise occur because of transient conditions and jitter when the input frequency approached a threshold limit. The differential between the reference frequencies is ordinarily adjusted so that it is greater than the power line frequency instability.

Because the circuit uses digital techniques, it is substantially insensitive to ambient temperature changes and line voltage fluctuations.

It will be appreciated that although specific circuit components have been described, these have been mentioned by way of illustration only. A wide variety of circuit components for performing the same functions are available in the known prior art.

Furthermore, although the circuit has been described with particular combinations of circuit connections, it will be obvious that the circuit may be revised to use suitable combinations of complementary signals to produce the same results within the teaching of the invention.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A frequency operated switch comprising input means for providing a first train of rectangular pulses having durations indicative of the period of an alternating input signal frequency to be monitored, reference means synchronized by pulses in said first train for providing second and third trains of rectangular reference pulses, the pulses in said second train having durations corresponding to a lower reference frequency equal to the minimum acceptable input signal frequency, the pulses in said third train having durations corresponding to an upper reference frequency intermediate the nominal signal frequency and the minimum acceptable frequency, logic means responsive to the pulses in the three pulse trains for initiating a disabling signal when the duration of the pulses in said first train exceeds the duration of the pulses in said second train and for maintaining a disabling signal until the duration of the pulses in said third train exceed the duration of the pulses in said first train.

2. The switch of claim 1 wherein the reference means includes first and second one-shot multivibrators for producing said second and third pulse trains respectively, each of said one-shot multivibrators being triggered by the leading edges of the pulses in said first train and having quasi-stable period adjusted to provide the desired pulse durations in the respective second and third pulse trains.

3. The switch of claim 2 wherein the logic means includes bistable pulse width comparator means for producing a first command signal which is switched to a first binary value when and only when the duration of the pulses in said first train exceeds the duration of the pulses in said second train and for producing a second command signal which is switched to said first binary value when and only when the duration of the pulses in said first train becomes less than the duration of the pulses in said third train, said logic means further including bistable latching means responsive to said command signals and arranged to initiate a disabling signal in response to a first command signal having said first binary value and to terminate a disabling signal in response to a second command signal having said first binary value.

4. A frequency operated switch for monitoring frequency deviations in an applied alternating input signal, said switch including input means for producing true and complementary rectangular pulse trains in which the individual pulses have durations equal to the period of the input signal, one-shot multivibrator means responsive to the leading edges of the pulses in said true pulse train, said multivibrator means being constructed and arranged to provide a train of lower frequency reference pulses having durations corresponding to a lower reference frequency equal to the minimum acceptable input frequency and a train of upper frequency reference pulses having durations corresponding to an upper reference frequency intermediate the nominal signal frequency and the minimum acceptable frequency, logic means including first and second bistable pulse width comparator means and a bistable latching means, said first and second bistable pulse width comparator means being coupled to receive lower and upper frequency reference pulses, respectively, from said one-shot multivibrator means and complementary and true pulses, respectively, from said input means, said first pulse width comparator means being constructed and arranged to transfer the instantaneous binary value of the applied complementary pulse to its output terminal in response to the termination of an associated reference pulse, said second pulse width comparator means being constructed and arranged to transfer the instantaneous binary value of an applied true pulse to its output terminal in response to the termination of an associated reference pulse, said bistable latching means having first and second input terminals and an output terminal, said first and second input terminals being coupled to the output terminals of said first and second output comparators, respectively, said latching means being constructed and arranged to switch to a first binary state in response to a low level signal applied to said first input terminal and to switch to a second binary state in response to a low level signal applied to said second input terminal, said latching means further including output terminal means for coupling a voltage representative of the binary state of the latching means to an external load.

5. The switch of claim 4 wherein the input means includes first flip-flop means arranged to switch to alternate bistable states in response to successive cycles of the applied output signal, said first flip-flop means having a pair of output terminals for providing said true and complementary pulse trains, one of the output terminals of said first flip-flop means being coupled to the input of said one-shot multivibrator means for simultaneously initiating said upper and lower frequency reference pulses in response to the initiation of a true pulse and to an input terminal on said second pulse width comparator, the other of said first flip-flop output terminals being connected to an input terminal on said first pulse width comparator means.

6. The switch of claim 5 wherein each of said pulse width comparator means includes a flip-flop of the type having Q and $\overline{Q}$ output terminals, signal input terminals and a clock pulse terminal, said clock pulse terminal being connected to switch the flip-flop to a binary state determined by the instantaneous value of a signal applied to its signal input terminal upon the reception of a signal at its clock pulse terminal, the clock pulse terminals of the first and second pulse width comparator flip-flops being coupled to receive said lower and upper reference pulse trains respectively.

7. The switch of claim 6 wherein said bistable latching means includes a flip-flop of the type having clear and preset terminals constructed and arranged so that a low level signal applied to one of the clear or preset terminals will switch the flip-flop to a first or second binary state respectively, said clear and preset terminals being connected to the Q terminals of said first and second pulse width comparators, respectively, said latching means flip-flop further having an output terminal for coupling a voltage representative of the binary state of that flip-flop to an external load.

* * * * *